(12) United States Patent
Kim et al.

(10) Patent No.: US 6,730,356 B2
(45) Date of Patent: May 4, 2004

(54) METHOD AND APPARATUS FOR FORMING PATTERN USING PRINTING METHOD

(75) Inventors: Eu-Gene Kim, Gyeonggi-Do (KR); Dong-Hoon Lee, Gyeonggi-Do (KR); Jung-Jae Lee, Gyeonggi-Do (KR); Dae-Hyun Nam, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/328,048

(22) Filed: Dec. 26, 2002

(65) Prior Publication Data

US 2003/0124866 A1 Jul. 3, 2003

(30) Foreign Application Priority Data

Dec. 31, 2001 (KR) ................. 10-2001-0089294

(51) Int. Cl.⁷ .................. B05D 5/00; H01L 21/311; G02F 1/13; B41N 3/00
(52) U.S. Cl. ............ 427/256; 438/694; 349/187; 101/465
(58) Field of Search ................. 438/694, 780, 438/725, 700; 428/901; 349/187, 2; 427/256, 287, 282; 101/465, 453, 458, 451, 33, 34

(56) References Cited

U.S. PATENT DOCUMENTS

| | | | |
|---|---|---|---|
| 2003/0021968 A1 * | 1/2003 | Clevenger et al. | 428/210 |
| 2003/0081095 A1 * | 5/2003 | Yi et al. | 347/101 |
| 2003/0122896 A1 * | 7/2003 | Jeong et al. | 347/46 |
| 2003/0124260 A1 * | 7/2003 | Baek | 427/384 |
| 2003/0124865 A1 * | 7/2003 | Baek et al. | 438/694 |

* cited by examiner

Primary Examiner—Tarifur R. Chowdhury
Assistant Examiner—Mike Qi
(74) Attorney, Agent, or Firm—Morgan, Lewis & Bockius LLP

(57) ABSTRACT

A method for forming a pattern, including the steps of preparing a cliché having a recess thereon corresponding to a position of a pattern, filling one of resist and ink within the recess of the cliché, affixing a substrate on which the pattern is to be formed on a loading plate, aligning the loading plate on the cliché, attaching the substrate on the loading plate to the cliché, and separating the substrate on the loading plate from the cliché.

12 Claims, 6 Drawing Sheets

METHOD AND APPARATUS FOR FORMING PATTERN USING PRINTING METHOD

The present invention claims the benefit of Korean Patent Application No. 89294/2001 filed in Korea on Dec. 31, 2001, which is hereby incorporated by reference.

BACKGROUND OF THE INVENTION

1. Field of the Invention

The present invention relates to a method and apparatus for forming a pattern, and particularly, to a method and apparatus for forming a pattern capable of simplifying the fabrication process improving productivity when a liquid crystal display device is fabricated by a printing method.

2. Discussion of the Related Art

In general, a cathode-ray tube (CRT) monitor has been mainly used for displaying information in a TV and a computer. The CRT has a high image quality and high screen brightness, and thereby the CRT has been the main stream of the display devices. However, as the screen size is increased, the size and weight of the CRT monitor is greatly increased occupying a large space, and becoming impractical as a portable device.

Flat panel display devices, such as a liquid crystal display (LCD), plasma display panel (PDP), organic electro luminescence (EL), light emitting diode (LED) and field emission display (FED), have been developed for solving the above problems. Among these flat panel display devices, the LCD is highlighted since it has been widely used in notebook PC's or computer monitors, and it has low power consumption.

FIG. 1 is a cross-sectional view of a liquid crystal display device according to the related art. As shown in FIG. 1, the LCD device comprises an upper substrate 10, a lower substrate 20 and a liquid crystal layer 30 formed therebetween. A color filter 11, which generates colored light, comprising a black matrix 12 for preventing light leaking between pixels and a resin layer including dyes or pigments of red, green, and blue colors, and are formed on the upper substrate 10. In addition, an over coat layer (not shown) may be formed on the color filter 11 for flattening the color filter 11 and improving bonding with an ITO, and a common electrode 13, which is a transparent conductive material for applying a voltage to the liquid crystal layer 30, are formed on upper part thereof. In addition, an alignment layer 14a for aligning liquid crystal molecules is formed on the common electrode 13.

A thin film transistor (T) and a pixel electrode 21, which is an electrode corresponding to the common electrode 13, are formed on the lower substrate 20. The thin film transistor (T) comprises a gate electrode 15 to which a scan signal is applied, an active layer 16 for transmitting data signals corresponding to the scan signal, a gate insulating layer 17 for electrically isolating the active layer 16 and the gate electrode 15, a source electrode 18a formed on an upper part of the active layer 16 for applying a data signal, and a drain electrode 18b for applying the data signal to a pixel electrode 21. The active layer 16 comprises a semiconductor layer 16a formed by depositing amorphous silicon (a-Si), and an ohmic contact layer 16b n+-doped on both upper sides of the semiconductor layer 16a.

A passivation layer 19 for exposing a part of the drain electrode 18b is formed on the thin film transistor (T), and the pixel electrode 21 and the drain electrode 18b are electrically connected through the exposing portion. In addition, the pixel electrode 21 and the common electrode 13 are formed as transparent electrodes made of an ITO so that light can be transmitted, and a second alignment layer 14b for aligning the liquid crystal molecules is formed on an upper part of the pixel electrode 21.

In order to fabricate the liquid crystal display device discussed above, a plurality of thin film deposition processes, photolithography processes and etching processes should be repeated. In order to fabricate the thin film transistor (T), the color filter 11, and the black matrix 12, a photoresist pattern is formed by an exposure process using a photoresist or a mask, and an etching process is performed thereafter. However, the above processes for forming the photoresist pattern are complex, and cost for fabricating the mask is increased as the substrate is increased. Therefore, a printing method by which the patterned resist can be formed without the exposing process has been recently suggested.

FIGS. 2A through 2D are cross sectional views of a method and apparatus for forming a pattern using a gravure offset printing method according to the related art. As shown in FIG. 2A, resist is applied onto a cliché 24 on which a recess 23 is formed, thereafter, a doctor blade 32 flattens the cliché on which the resist is applied. At that time, the resist 31 is formed in the recess 23, and any other resist remaining on the area is removed.

As shown in FIG. 2B, a roller 33 is rotated contacting the cliché 24, and the resist 31 filled in the recess 23 of the cliché 24 is transferred onto the roller 33.

As shown in FIG. 2C, a substrate 10a on which a pattern will be formed is loaded on a lower part of the roller 33, and the roller 33 is rotated to re-transfer the resist 31a onto the substrate 10a.

FIG. 2D shows the resist pattern 31a formed on the substrate 10a through the above gravure offset printing process.

FIG. 3 is a planar view of a gravure offset printing apparatus according to the related art. As shown in FIG. 3, in the gravure offset printing apparatus, the cliché 24, on which the concave recess 23 is formed, and a stage 25, on which the substrate 10a for forming the pattern is disposed, are integrally constructed. The roller 33 is provided for transferring the resist pattern onto the substrate 10a from the cliché 24. The roller 33 can be rotated and reciprocated between the cliché 24 and the stage 25, and the roller 33 stained with the resist filled in the cliché 24 transfers the resist pattern onto the substrate in one rotation.

FIG. 4 is a cross-sectional view of the gravure printing apparatus taken along I–I' of FIG. 3. The cliché 24, on which the recess 23 is formed, and the stage 25 are integrally formed, and the roller 33 located on an upper part of the cliché 24 moves between the cliché 24 and the stage 25 to form the resist pattern on the substrate 10a. In order to re-transfer the resist transferred from the cliché 24 onto the substrate 10a in one try, a width of the roller 33 should be the same or more as that of the substrate. Therefore, the size of the roller increases as the size of the liquid crystal panel is increased, and thereby cost for fabricating the roller is increased. When the resist is transferred onto the roller 33 from the cliché, the resist is not smoothly separated from the recess of the cliché. Therefore, some resist remains in the recess, and the surface of the resist transferred to the roller is not flat. Thereby, a gap between the substrate and the resist is formed when the resist is re-transferred onto the substrate. When the substrate is etched in the etching process, etchant flows into the gap and the part is etched unnecessarily. Therefore, a fatal error may occur in the display device which requires a pattern of high precision. Also, the resist remaining on the roller should be cleaned regularly.

SUMMARY OF THE INVENTION

Accordingly, the present invention is directed to a method and apparatus for forming a pattern using a printing method that substantially obviates one or more of the problems due to limitations and disadvantages of the related art.

An object of the present invention is to provide simplified fabrication processes and a printing apparatus for transferring a resist pattern onto a substrate after attaching the substrate on a cliché without a roller.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. To achieve these and other advantages and in accordance with the purpose of the present invention, as embodied and broadly described herein, there is provided a method for forming a pattern including the steps forming a recess on a cliché corresponding to a position of a pattern, filling one of resist and ink within the recess of the cliché, affixing a substrate on which the pattern is to be formed on a loading plate, aligning the loading plate on the cliché, attaching the substrate to the cliché, and separating the substrate from the cliché.

In another aspect of the invention, there is provided a method for forming a pattern including the steps of forming a recess on a cliché corresponding to a position of a pattern to be formed, filling one of resist and ink within the recess of the cliché using a doctor blade, affixing a substrate on which the pattern will be formed on a loading plate, aligning the loading plate on the cliché, attaching the substrate to the cliché, and setting a temperature of the loading plate to be higher than a temperature of the cliché, separating the loading plate from the cliché, and separating the substrate from the loading plate.

In another aspect of the invention there is provided an apparatus for forming a pattern including a cliché having at least one recess for forming a pattern, a loading plate including a vacuum chuck and a heater, and a substrate.

It is to be understood that both the foregoing general description and the following detailed description, are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
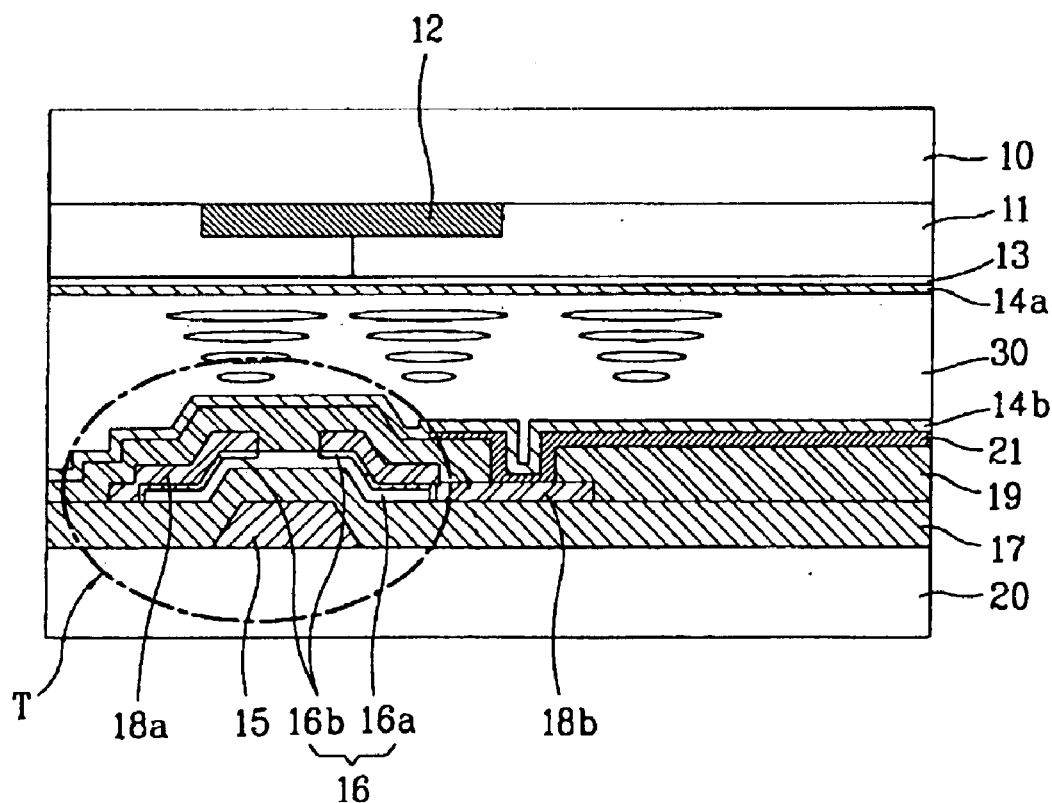
FIG. 1 is a cross-sectional view of a general liquid crystal display device according to the related art.
Figure 2A:
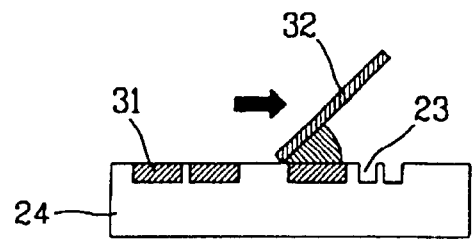
FIGS. 2A through 2D are cross sectional views of a method for forming a pattern using a gravure offset printing method according to the related art.
Figure 2B:
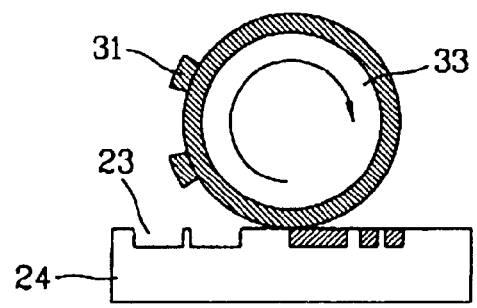
Figure 2C:
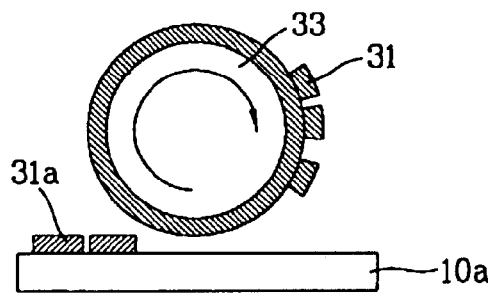
Figure 2D:
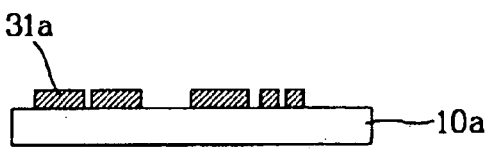
Figure 3:
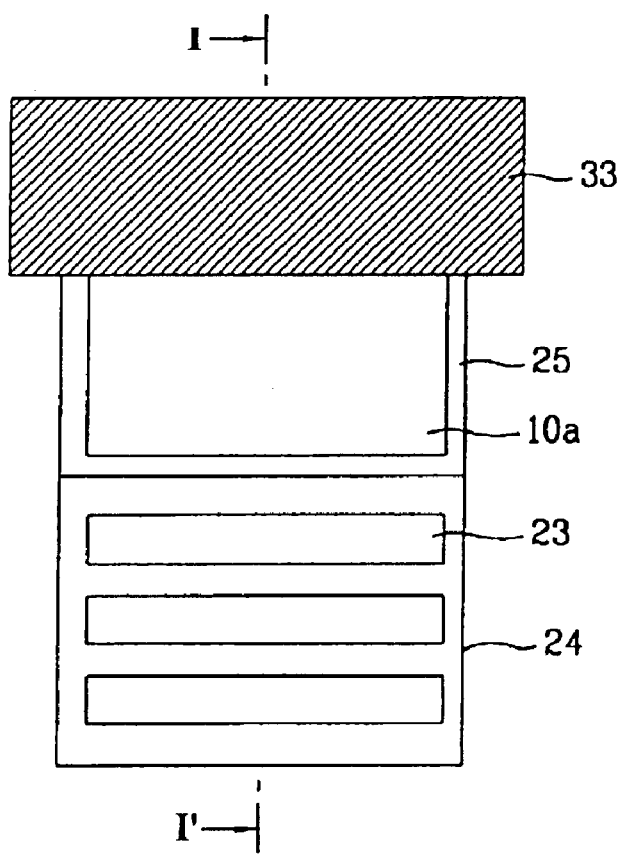
FIG. 3 is planar view of a gravure offset printing apparatus according to the related art.
Figure 4:
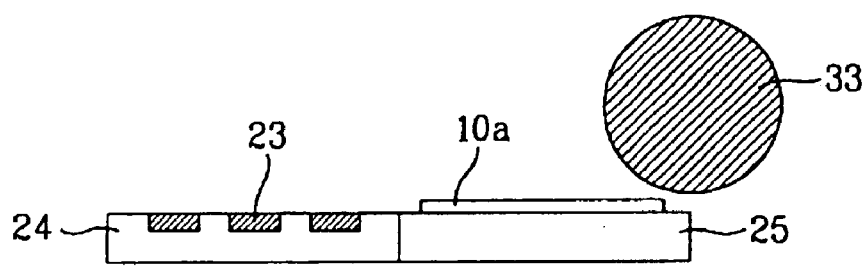
FIG. 4 is a cross sectional view of the gravure printing apparatus taken along I–I' of FIG. 3.
Figure 5A:
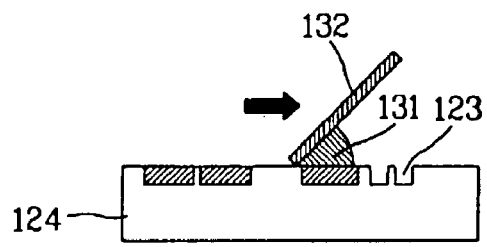
FIGS. 5A through 5G are cross sectional views of an exemplary method and apparatus for forming a pattern according to the present invention.

FIGS. 5A through 5G are cross sectional views of an exemplary method and apparatus for forming a pattern according to the present invention. As shown in FIG. 5A, resist (or ink) 131 may be applied on a cliché 124 on which a recess 123 of right angles is formed, and a doctor blade 132 may flatten the cliché 124 on which the resist is applied. In the area flattened by the doctor blade 132, the resist (or ink) may be filled only in the recess 123 of the cliché, and the resist remaining in an area other than the recess is removed.

Figure 5B:
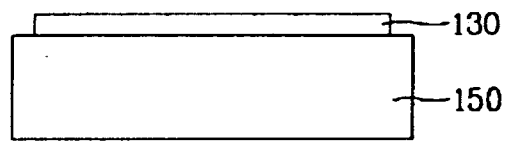

In FIG. 5B, a substrate 130 on which a pattern will be formed may be mounted on a loading plate 150. At that time, a metal for forming a pattern of a gate line and source/drain electrodes (or SiOx or SiNx) for forming a passivation layer may be formed on the substrate 130. When the substrate 130 is mounted on the loading plate 150, a vacuum chuck (not shown) formed on the loading plate 150 may uniformly affix the substrate 130 on the loading plate 150. In addition, a heater (not shown) may be disposed on the loading plate 150 to heat the substrate 130 mounted on the loading plate 150. A structure and function of the loading plate will be described in more detail as follows.

Figure 6:
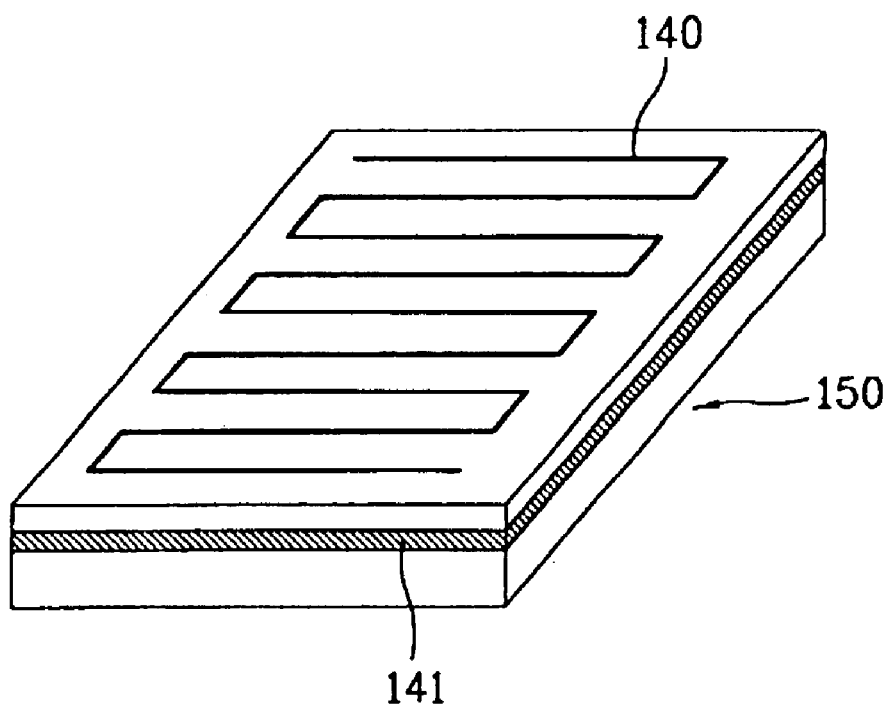
FIG. 6 is a planar view of an exemplary loading plate of a printing apparatus according to the present invention.

FIG. 6 is a planar view of an exemplary loading plate of a printing apparatus according to the present invention. As shown in FIG. 6, the loading plate 150 may include the vacuum chuck 140 and the heater 141. The vacuum chuck 140 may be formed to uniformly affix and flatten the substrate (not shown), and is operated on an entire surface of the substrate when the substrate is mounted on the loading plate 150.

As the size of substrates increases, bowing of the substrates may occur Accordingly, if a substrate is attached to the cliché 124 having a bow, pressures in parts where the cliché 124 and the substrate 130 contact may vary from each other, thereby causing inferiority on the pattern transferred onto the substrate 130. Thus, the vacuum chuck 140 affixes the substrate 130 so that is does not fall down, and uniformly loads the substrate onto the loading plate 150. Thus, the inferior pattern caused by the bowing of the substrate may be prevented.

The heater 141 may be disposed for causing the resist (or ink) filled in the recess 123 to be easily separable from the cliché 124, and may be attached to the substrate 130 by making use of a bonding difference between the resist and the recess. Since the adhesive characteristics of the resist is dependent upon temperature, the resist (or ink) may be easily separated from the cliché 124 and attached to the substrate 130 using the temperature difference between the cliché 124 and the substrate 130.

For transferring the resist (or ink) on the cliché 124 onto the substrate 130, the bonding of the resist may be stronger for the substrate 130 than for the cliché 124 in order to separate the resist (or ink) from the cliché 124. In general, the resist may be easily attached to a side of the cliché 124 having a higher temperature, whereby the resist (or ink) can be easily separated from the cliché 124 and attached to the substrate 130 if there is a temperature difference between the cliché 124 and the substrate 130. When using resist (or ink) having a bonding property dependent upon higher temperatures, the temperature of the substrate may be higher than that of the cliché 124, whereby, the resist (or ink) filled in the recess of the cliché 124 can be easily attached to the substrate 130 having the higher temperature. Thus, the heater (not shown) may be placed in the loading plate 150 for loading the substrate 130, in order to increase the temperature of the substrate 130. The temperature of the substrate 130 which is attached on the plate 150 may be increased indirectly by heating the plate 150 using the heater (not shown).

Figure 5C:
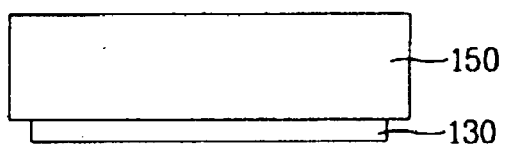

In addition, as shown in FIG. 5C, in order to orient the substrate 130, upon which the pattern is formed, to face downward, the loading plate 150 on which the substrate 130 is mounted may be overturned to change position of the substrate 130 and the loading plate 150. Even if the position of the substrate 130 and the loading plate 150 is reversed, the substrate 130 may be attached evenly to the loading plate 150 by the vacuum chuck 140 formed on the loading plate 150.

Figure 5D:
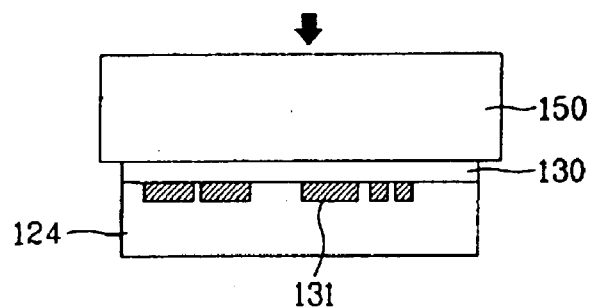

In addition, as shown in FIG. 5D, the loading plate 150 may be mounted on the cliché 124 so that a surface of the cliché 124 upon which the resist is filled contacts the substrate 130. Thereafter, the temperature of the substrate 130 may be increased higher than a temperature of the cliché 124 so that the resist (or ink) 131 filled in the recess of the cliché 124 can be separated and attached to the substrate 130. At that time, the temperature of substrate 130 may be controlled by the heater (not shown) formed in the loading plate 150. The temperature of the substrate 130 may be controlled by heating the loading plate 150 from outer side after attaching the cliché 124 and the loading plate 150 without the heater (not shown) in the loading plate 150.

Figure 5E:
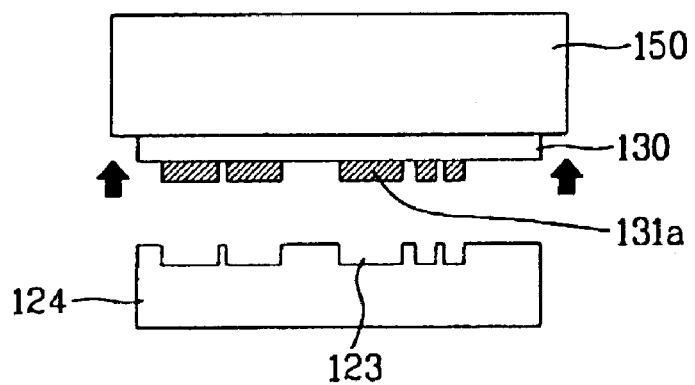
Figure 5F:
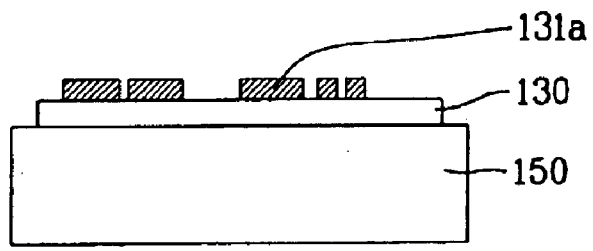

In addition, as shown in FIG. 5E, when the loading plate 150 is separated from the cliché 124, the resist (or ink) filled in the recess of the cliché 124 may separate from the cliché 124 and bond to the substrate 130.

Figure 5G:
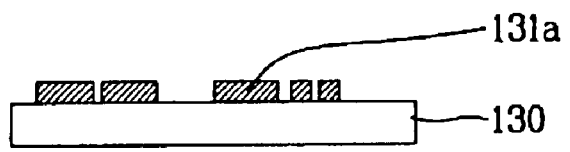

As shown in FIG. 5G, the substrate 130 may be separated from the loading plate 150, and the resist (or ink) pattern 131a may be formed on the substrate 130.

As described above, the method for forming the pattern according to the present invention, the printing apparatus is constructed with only the cliché on which the recess is formed and the loading plate for flattening the substrate, and therefore, the space occupied by the apparatus is very small. And the processes for forming the pattern is simple, and thereby, the processing time and the cost can be reduced, and it is also advantageous for fabricating a panel of larger area.

Also, the heater may be disposed in the loading plate to make the resist (or ink) be separated from the cliché easily, and therefore, the inferiority on the pattern can be prevented and the pattern can be formed precisely when comparing to the conventional method using the roller.

It will be apparent to those skilled in the art that various modifications and variations can be made in the method for forming a pattern using the printing method of the present invention without departing from the spirit or scope of the invention. Thus, it is intended that the present invention cover the modifications and variations of this invention provided they come within the scope of the appended claims and their equivalents.

What is claimed is:

1. A method for forming a pattern, comprising the steps of:
   preparing a cliché having a recess thereon corresponding to a position of a pattern;
   filling one of resist and ink within the recess of the cliché;
   affixing a substrate on which the pattern is to be formed on a loading plate;
   aligning the loading plate on the cliché;
   attaching the substrate on the loading plate to the cliché; and
   separating the substrate on the loading plate from the cliché.

2. The method according to claim 1, wherein the loading plate includes a vacuum chuck.

3. The method according to claim 2, wherein the vacuum chuck is formed evenly on an entire surface of the loading plate.

4. The method according to claim 1, wherein a heater is included within the loading plate.

5. The method according to claim 1, wherein a temperature of the loading plate is higher than a temperature of the cliché.

6. The method according to claim 1, wherein the step of filling one of a resist and ink in the recess of the cliché includes a step of applying the one of the resist and ink on the cliché, and flattening the cliché using a doctor blade.

7. The method according to claim 1, wherein a metal material is applied on the substrate.

8. The method according to claim 1, wherein one of SiOx and SiNx is applied on the substrate.

9. A method for forming a pattern, comprising the steps of:
   preparing a cliché having a recess thereon corresponding to a position of a pattern to be formed;
   filling one of resist and ink within the recess of the cliché using a doctor blade;
   affixing a substrate on which the pattern will be formed on a loading plate;
   aligning the loading plate on the cliché;
   attaching the substrate on the loading plate to the cliché; and
   setting a temperature of the loading plate to be higher than a temperature of the cliché;
   separating the substrate on the loading plate from the cliché; and
   separating the substrate from the loading plate.

10. The method according to claim 9, wherein the temperature of the substrate is controlled by a heater within the loading plate.

11. The method according to claim 9, wherein the temperature of the substrate is increased by heating the loading plate.

12. An apparatus for forming a pattern, comprising:
   a cliché having at least one recess for forming a pattern;
   a loading plate including a vacuum chuck and a heater; and
   a substrate.

* * * * *